United States Patent
Zhu

(10) Patent No.: US 7,824,969 B2
(45) Date of Patent: Nov. 2, 2010

(54) FINFET DEVICES AND METHODS FOR MANUFACTURING THE SAME

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 12/018,492

(22) Filed: Jan. 23, 2008

(65) Prior Publication Data

US 2009/0184369 A1   Jul. 23, 2009

(51) Int. Cl.
*H01L 21/332* (2006.01)
(52) U.S. Cl. ........................ 438/137; 438/136; 438/268; 438/138; 438/156; 257/E21.411; 257/327; 257/328; 257/302
(58) Field of Classification Search ................. 438/197, 438/149, 136, 268, 137, 138, 156, 212; 257/E21.411, 257/302, 327, 328
See application file for complete search history.

(56) References Cited

U.S. PATENT DOCUMENTS

| 7,473,964 | B2 * | 1/2009 | Izumida | 257/336 |
| 2009/0008705 | A1 * | 1/2009 | Zhu et al. | 257/327 |
| 2009/0020764 | A1 * | 1/2009 | Anderson et al. | 257/77 |

* cited by examiner

*Primary Examiner*—Thao X Le
*Assistant Examiner*—Thanh Y Tran
(74) *Attorney, Agent, or Firm*—Cantor Colburn LLP; Joseph Abate

(57) ABSTRACT

Disclosed herein is a tunneling fin field effect transistor comprising a fin disposed on a box layer disposed in a wafer; the wafer comprising a silicon substrate and a buried oxide layer. The fin comprises a silicide body that comprises a first silicide region and a second silicide region and forms a short between N and P doped regions. The silicide body is disposed on a surface of the buried oxide layer. A tunneling device disposed between the first silicide region and the second silicide region; the tunneling device comprising a first P-N junction. A gate electrode is further disposed around the fin; the gate electrode comprising a second P-N junction, and a third silicide region; the third silicide region forming a short between N and P doped regions in the gate electrode.

13 Claims, 13 Drawing Sheets

(TOP VIEW)

(SIDE VIEW ALONG AA')

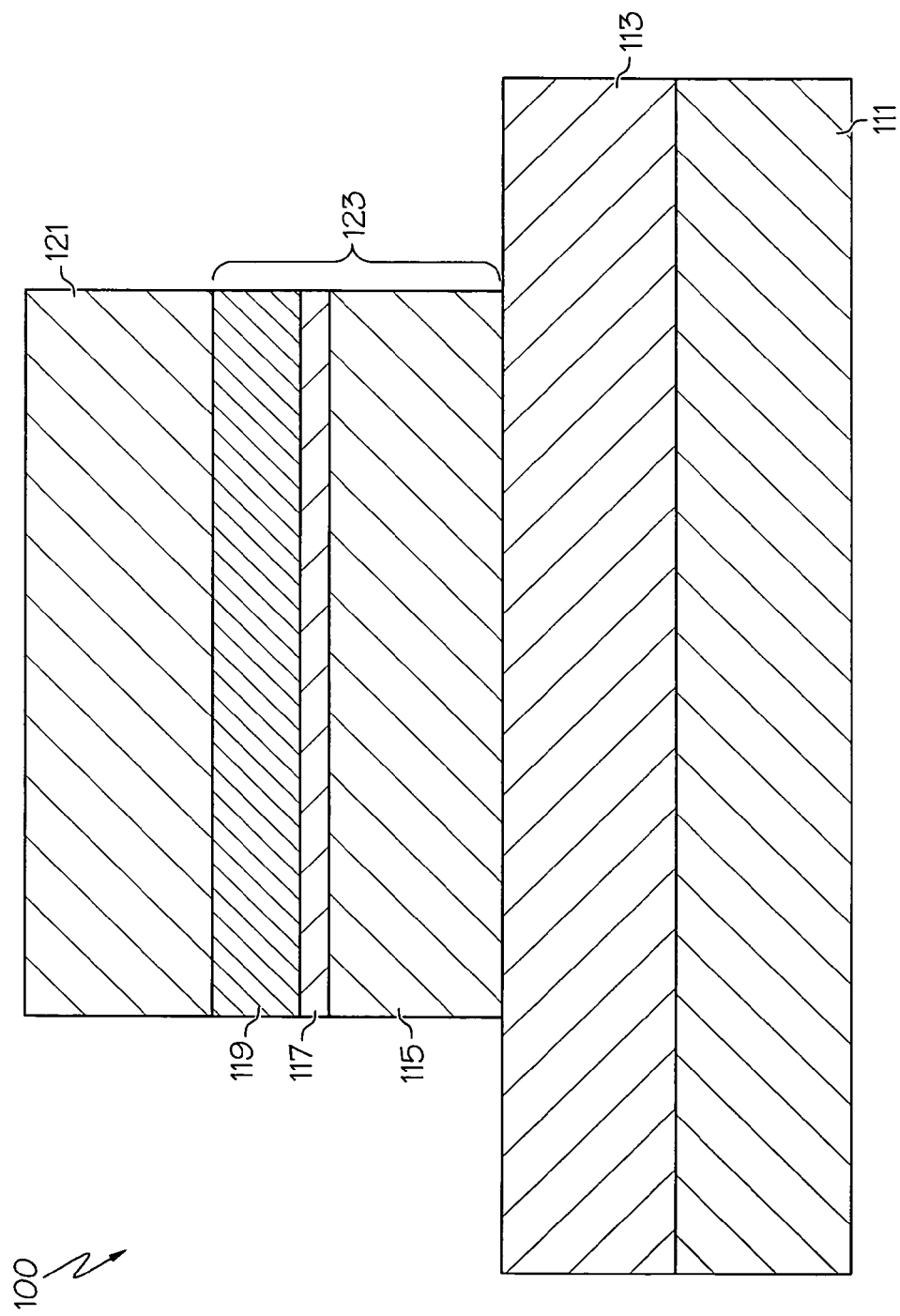

(SIDE VIEW)

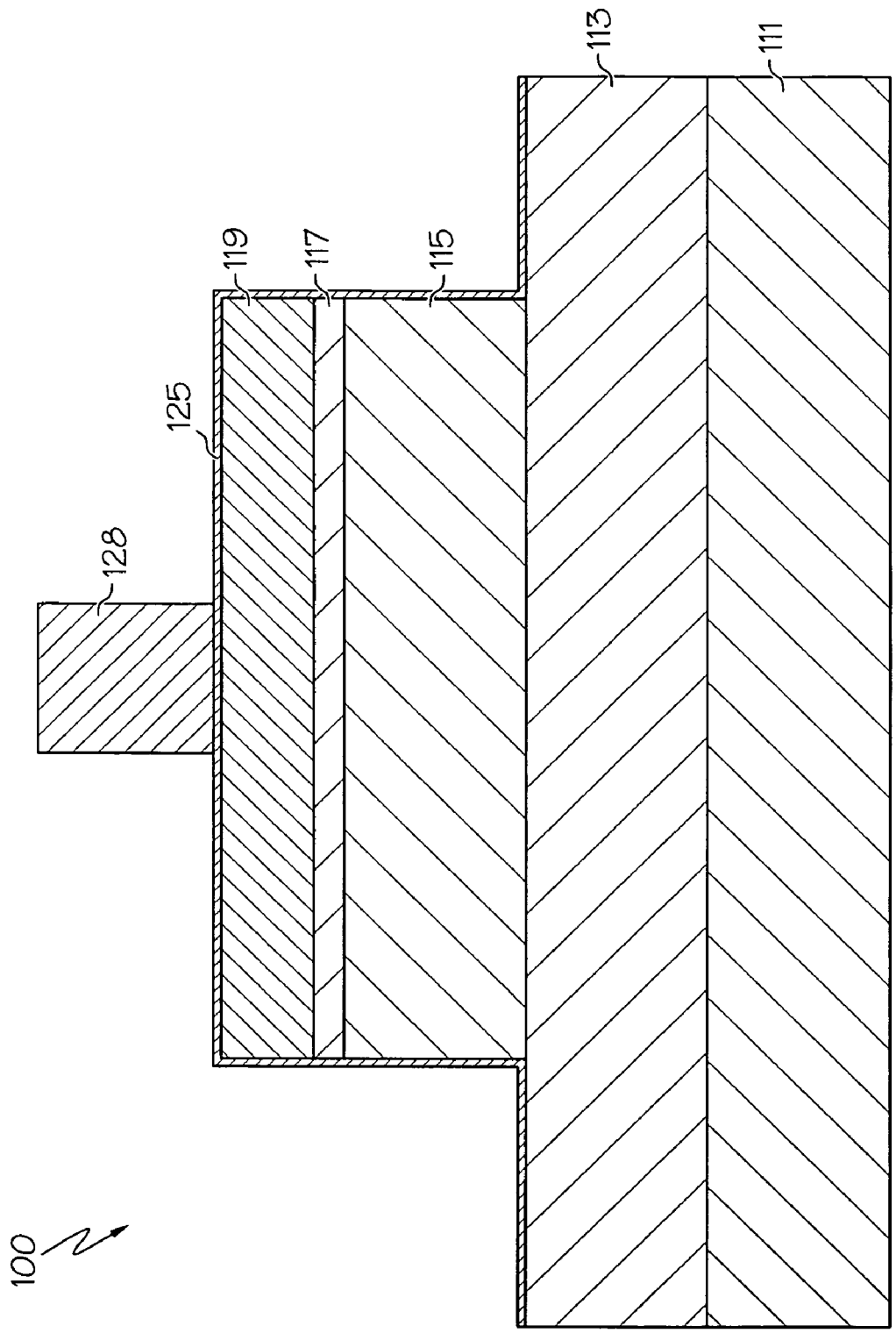

(SECTION ALONG BB')

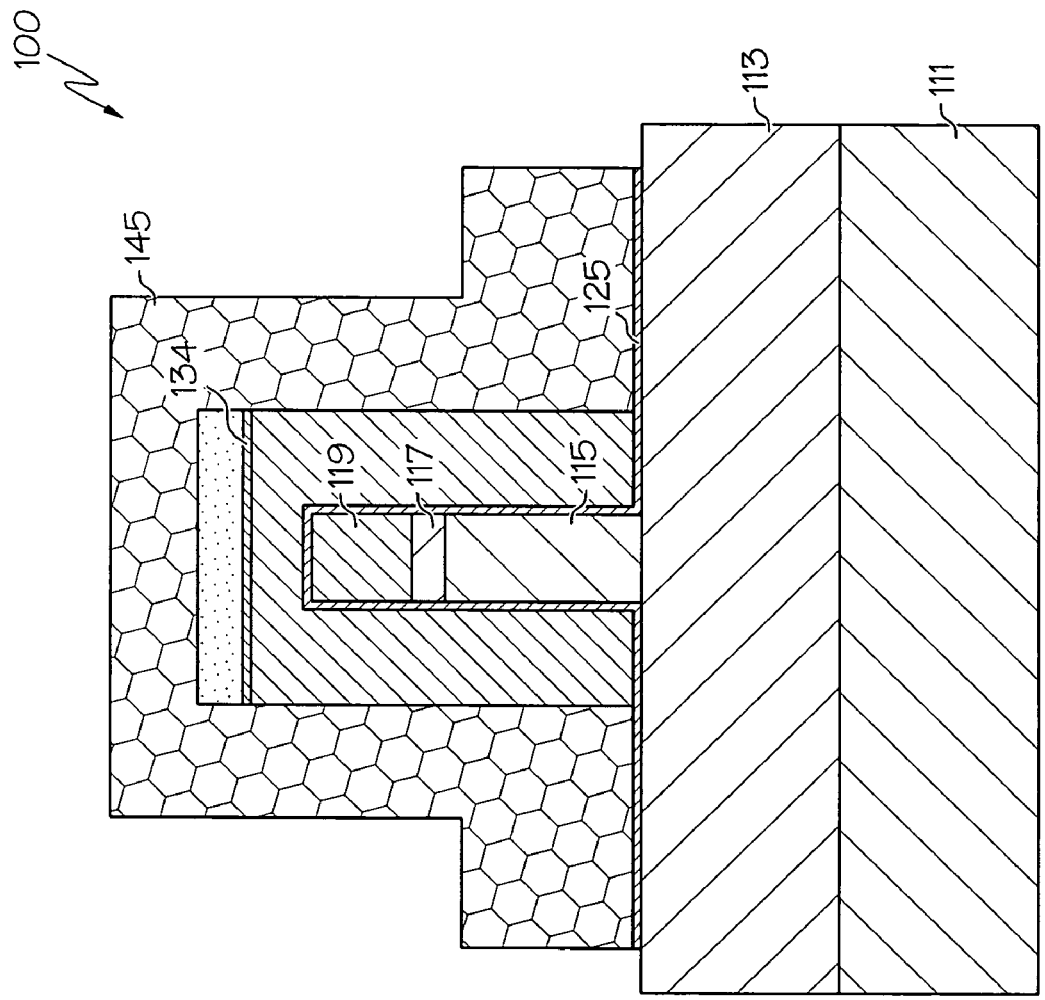

FINFET DEVICES AND METHODS FOR MANUFACTURING THE SAME

BACKGROUND

This disclosure relates to finFET devices and to methods for manufacturing the same.

Metal-Oxide-Semiconductor field effect transistor (MOSFET) technology is the dominant electronic device technology in use today. Performance enhancement and cost reduction between generations of integrated circuits (ICs) is generally achieved by reducing the size of transistors in the ICs, resulting in an enhancement in transistor speed and increasing integrated transistor area density. This is generally referred to as transistor "scaling".

Ultra-large-scale integrated (ULSI) circuits generally include a multitude of transistors, such as more than one million transistors and even several billion transistors that cooperate to perform various functions for an electronic component. The transistors are generally complementary metal oxide semiconductor field effect transistors (CMOSFETs) that include a gate conductor disposed between a source region and a drain region. The gate conductor is provided over a thin gate oxide material or high-k material. Generally, the gate conductor can be a metal, a polysilicon, or polysilicon/germanium ($Si_xGe_{(1-x)}$) material that controls charge carriers in a channel region between the drain and the source to turn the transistor on and off. The transistors can be N-channel MOSFETs or P-channel MOSFETs.

In semiconductor-on-insulator (SOI) semiconductor-type devices, transistors such as MOSFETs, are built on the top surface of a SOI substrate. The substrate is doped to form source and drain regions, and a conductive layer is provided between the source and drain regions. The conductive layer operates as a gate for the transistor; the gate controls current in a channel between the source and the drain regions. As transistors become smaller, the SOI thickness of the transistor is scaled down to achieve superior short-channel performance.

As MOSFETs are scaled to channel lengths below 100 nm, conventional MOSFETs suffer from several problems. In particular, interactions between the source and drain of the MOSFET degrade the ability of the gate to control whether the device is on or off. This phenomenon is called the "short-channel effect" or SCE.

In order to reduce SCE, double-gate MOSFET structures have been designed. In a double-gated MOSFET, a second gate is disposed in the device between the source and the drain such that there is a gate on either side of a channel that connects the source and the drain. This allows gate control of the channel from both sides, reducing SCE. Additionally, when the device is turned on using both gates, two conduction ("inversion") layers are formed, allowing for more current flow. An extension of the double-gate concept is the "surround-gate" or "wraparound-gate" concept, where the gate is placed such that it completely or almost-completely surrounds the channel, providing better gate control.

As one type of double gate device, finFET devices have received significant attention because of their advantages related to high drive current, high immunity to short channel effects, and relative easiness of manufacture.

However, as the miniaturization of semiconductor devices proceeds, patterning narrow, dense active regions has become more challenging. For example, conventional lithographic tools are unable to accurately and precisely define active regions as structures or features with dimensions below 100 nm or 50 nm. It is therefore desirable to have a manufacturing process that affords the patterning of narrow, dense, active regions that can be used for fabricating a finFET device. It is also desirable that the manufacturing process be compatible with existing MOSFET fabrication processes.

SUMMARY

Disclosed herein is a tunneling fin field effect transistor comprising a fin disposed on a box layer disposed in a wafer; the wafer comprising a silicon substrate and a buried oxide layer; the fin comprising a silicide body a comprising a first silicide region and a second silicide region; the silicide body forming a short between N and P doped regions; the silicide body being disposed on a surface of the buried oxide layer; and a tunneling device disposed between the first silicide region and the second silicide region; the tunneling device comprising an N+ (P+) doped silicon on insulator region in contact with a P+ (N+) doped silicon on insulator region to form a first P-N junction; and a gate electrode disposed around the fin; the gate electrode comprising an N+ doped polysilicon in contact with a P+ doped polysilicon to form a second P-N junction, and a third silicide region; the third silicide region forming a short between N and P doped regions in the gate electrode.

Disclosed herein too is a method of forming a tunneling fin field effect transistor comprising disposing a pad oxide layer and a silicon nitride mask layer on a silicon on insulator layer; the silicon on insulator layer comprising a silicon wafer, a buried oxide layer and a silicon on insulator layer; the silicon on insulator layer comprising a P+ type or N+ type doped silicon on insulator; etching a fin; the fin comprising the silicon on insulator layer, the pad oxide layer and the silicon nitride mask layer; disposing a high dielectric constant layer and an electrically conducting layer on the fin; reactively ion etching the electrically conducting layer to form a gate electrode; disposing an oxide offset spacer on the gate electrode; ion implanting a N+ dopant or a P+ dopant in the fin; the ion implanting being conducted at an angle of about 45 to about 80 degrees, with respect to a longitudinal axis of the wafer; the ion implanting creating a source region and a drain region in the fin; the ion implanting also creating a N-doped or a P-doped region in the gate electrode; disposing a nitride spacer on the gate electrode; disposing a nickel silicide layer on the wafer to form an electrical short between N+ and P+ doped regions; and forming a tunneling device on the buried oxide layer; the tunneling device comprising an N+ doped region and the P+ type doped silicon on insulator.

Disclosed herein too are article that use the aforementioned transistor and the aforementioned method.

BRIEF DESCRIPTION OF FIGURES

FIG. 3 is an exemplary side view of the device after reactive ion etching;

FIG. 5B is an exemplary side view of the device taken along section AA' of the FIG. 5A after the RIE of the gate electrode;

FIG. 7C is an exemplary side view of the device taken along section BB' of the FIG. 7A after the silicidation and the formation of the nickel silicide layer.

DETAILED DESCRIPTION

Figure 1:
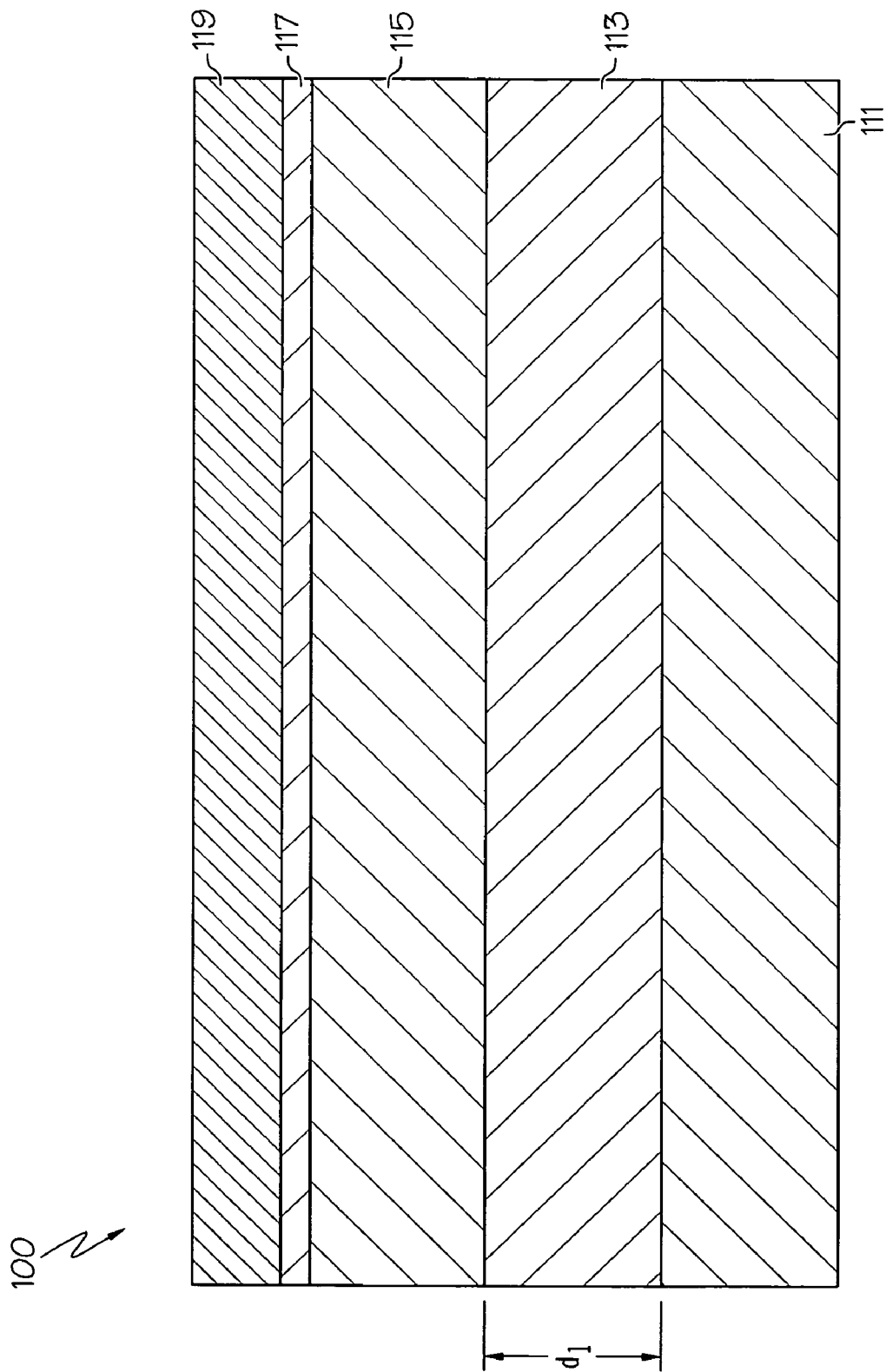
FIG. 1 is an exemplary side view of a multilayered device that is used to manufacture the tunneling finFET device; the multilayered device comprises a silicon nitride mask layer and a pad oxide layer disposed upon a silicon wafer.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Disclosed herein too is a structure for a tunneling finFET device that comprises a vertical fin and self-aligned gates "wrapped around" over both sides and the top of the vertical fin. The thin vertical fins can produce "thin-body" effects, e.g., enhanced mobility and volume inversion. The "wrap around gate" places a gate so that it completely or almost-completely surrounds at least a portion of the fin or channel and thus, provides excellent gate control for turn-off and turn-on performance with the known advantages of "thin-body" effects. The multi-gated finFET device disclosed herein can be produced inexpensively because of the low substrate cost that comes from using a silicon wafer as the substrate, if desired.

In an exemplary embodiment, the tunneling finFET device comprises a first fin having a first gate electrode disposed across the first fin; the gate electrode contacting opposing surfaces of the fin; the fin comprising a single P-N junction that functions as a tunneling device. The tunneling finFET device comprises a first nickel silicide layer disposed on a buried oxide layer and in contact with the P-N junction, that acts as a short between P and N doped regions of the tunneling finFET device. The tunneling finFET device comprises a second nickel silicide layer disposed on the gate electrode and in contact with a P-N junction formed on the gate electrode that acts as a short between P+ and N+ doped regions on the gate electrode.

Disclosed herein too is a method for forming the tunneling finFET device that improves device uniformity. The tunneling finFET device disclosed herein has a number of advantages chiefly that it reduces sub-threshold swing and facilitates lower power consumption. Tunneling finFET devices have several advantages over other commercially available finFET devices that do not use tunneling. For examples, tunneling finFET devices have smaller sub-threshold swings, display no body effect, use low stand-by power, and are insensitive to operating temperatures when compared with other available finFET devices that do not use tunneling.

FIGS. 1-7C will now be used to depict an exemplary method of manufacturing the tunneling finFET device 100. It is to be noted that in the text as well as in all of the Figures, the respective structures will be termed the "device" and will be referred to by the number "100" though the device is not yet a finFET device 100 till some of the last stages of manufacturing described herein. This is done primarily for the convenience of the reader.

With respect to the FIG. 1, an SOI wafer comprising a wafer 111, a buried oxide layer 113 and a SOI layer 115 may be used as a starting point for the development of the device 100. Wafer 111 may comprise germanium, silicon, or a combination of germanium and silicon such as silicon-germanium. In an exemplary embodiment, the wafer comprises silicon. The wafer 111 has a buried oxide (BOX) layer 113 disposed thereon. In one embodiment, the BOX layer 113 can comprise silicon dioxide produced by doping the silicon wafer 111 with oxygen as a dopant. An ion beam implantation process followed by high temperature annealing can be used to form a BOX layer 113. In another embodiment, the SOI wafer can be manufactured by wafer bonding, where the BOX layer 113 and the SOI layer 115 can be separately adhered to the wafer 111.

The silicon-on-insulator (SOI) layer 115 is disposed upon the BOX layer 113 and generally has a thickness of about 50 to about 200 nanometers. As depicted in the FIG. 1, the SOI layer is implanted with a P+ dopant such as boron or an N+ dopant such as arsenic, phosphorus and gallium and annealed to activate the dopant. The dopant is generally added in a concentration of about $10^{19}$ to about $10^{21}$ atoms/cm$^3$.

A pad oxide layer 117 having a thickness of about 5 to about 10 nanometers and a silicon nitride mask 119 having a thickness of about 20 to about 50 nanometers are then sequentially disposed upon the surface of the SOI layer 115.

Figure 2A:
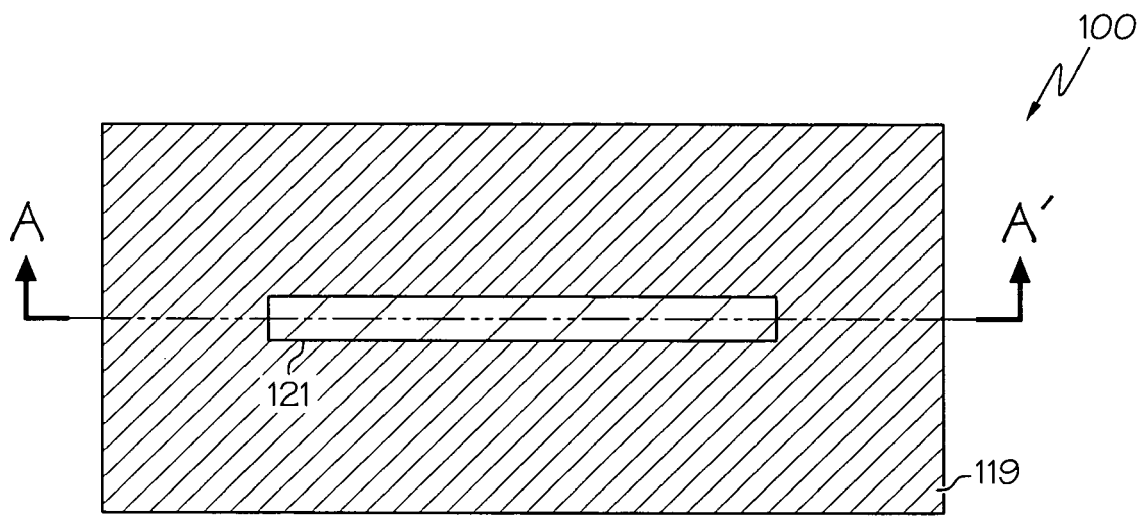
FIG. 2A is an exemplary top view of a photoresist that is disposed upon the device of the FIG. 1.
Figure 2B:
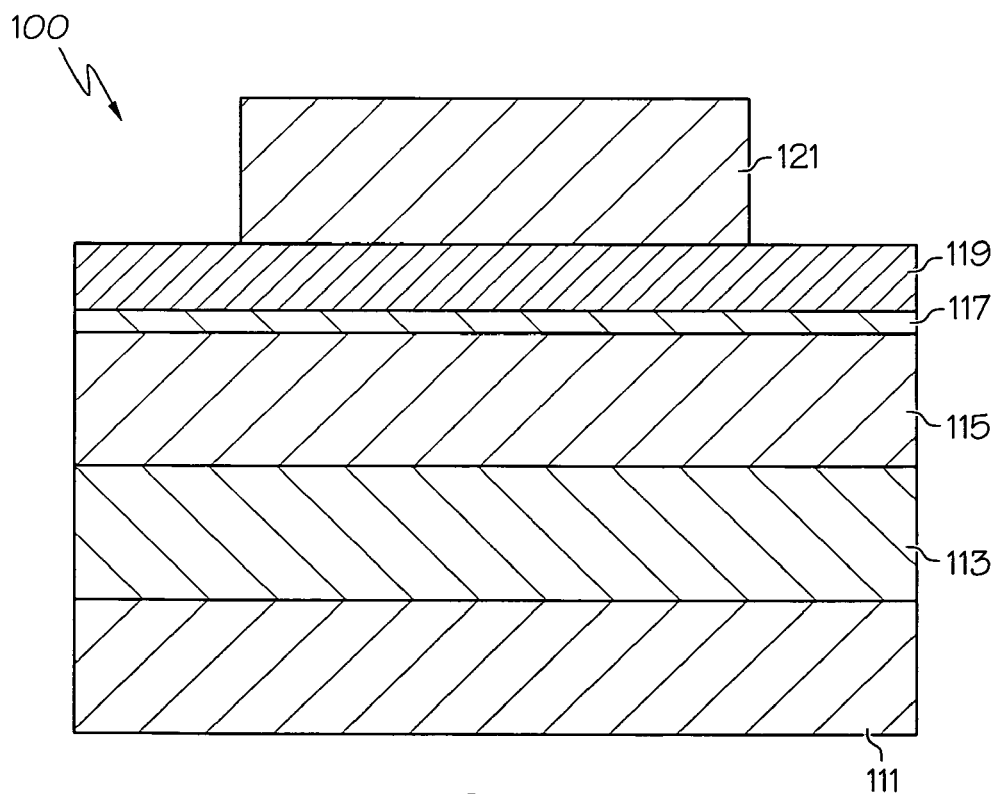
FIG. 2B is an exemplary side view of the FIG. 2A.

With reference now to the FIGS. 2A and 2B, a first photoresist mask 121 having a width of about 5 to about 10 nanometers is then disposed upon the silicon nitride mask. The FIG. 2B is a side view of the FIG. 2A taken along the section AA'. The width of the first photoresist mask 119 determines the width of the fin. Following the deposition of the first photoresist mask 119, a series of etches are performed to form the fin 123, depicted in the FIG. 3. The etching can all be accomplished via reactive ion etching (RIE).

In one embodiment, a single RIE may be conducted to remove all three layers. In another embodiment, different RIE's may be conducted to remove different layers. For example, a first RIE may be conducted to remove the silicon nitride mask 119. A second RIE may be conducted to remove the pad oxide layer 117, while a third RIE may be conducted to remove the doped silicon-on-insulator layer 115. The RIE is stopped when the surface of the BOX layer 113 is reached. RIE can be conducted with halogenated compounds such as $CHF_3$, $Cl_2$, $CF_4$, $SF_6$, or the like, or a combination comprising at least one of the foregoing halogenated compounds.

Figure 4A:
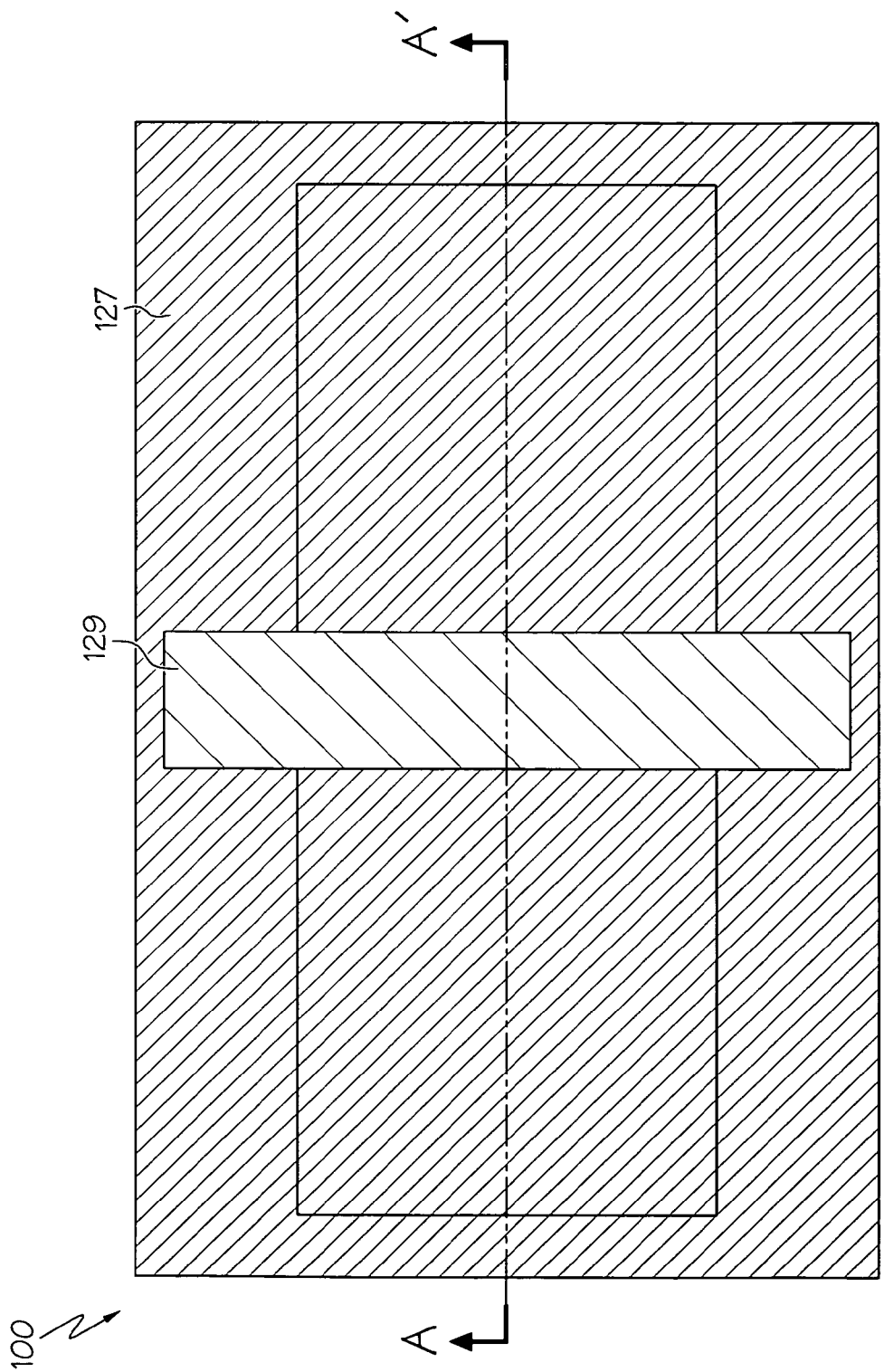
FIG. 4A is an exemplary top view of the device after the deposition of the high dielectric constant layer and the electrically conducting layer.
Figure 4B:
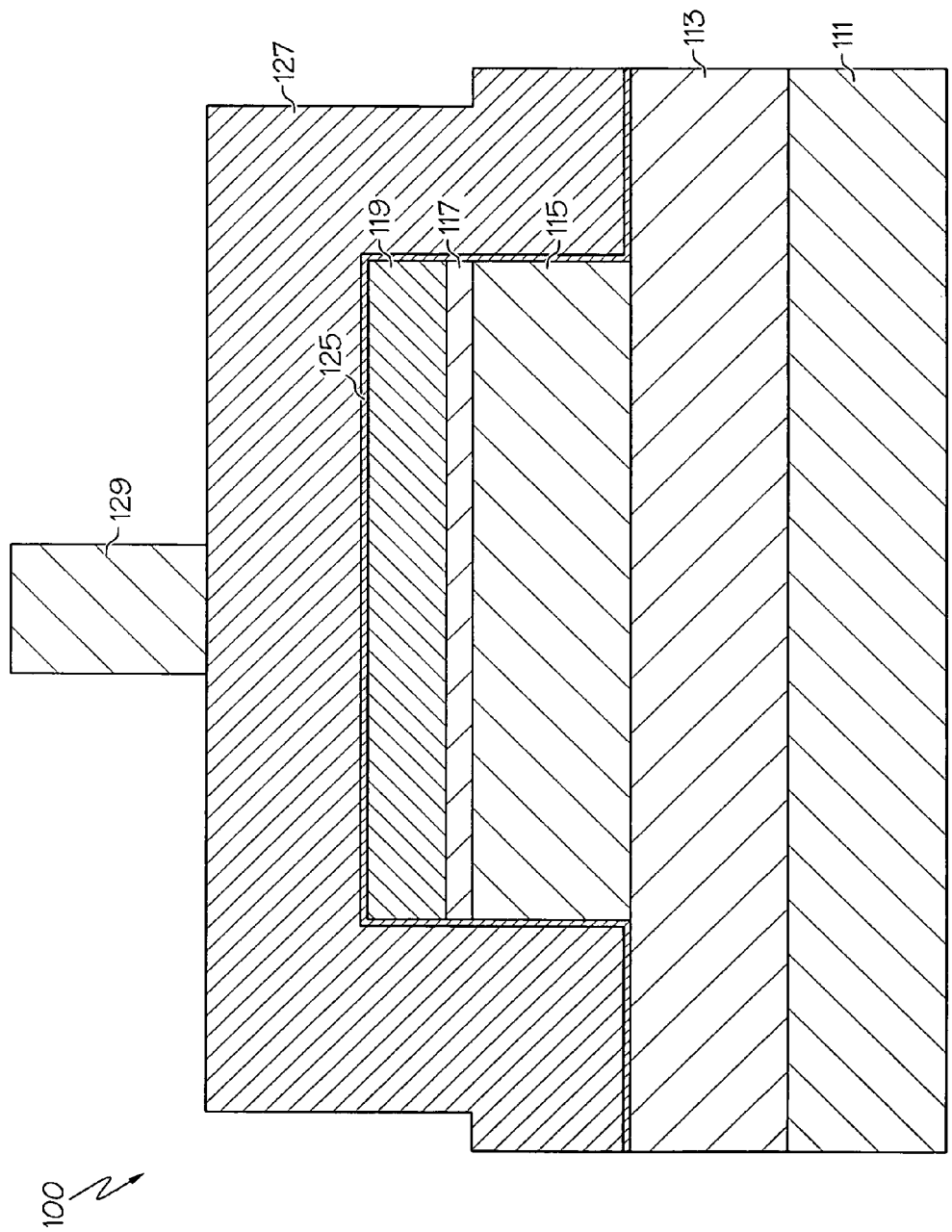
FIG. 4B is an exemplary side view of the device after the deposition of the high dielectric constant layer and the electrically conducting layer.

Following the completion of the RIE, the first photoresist mask 121 is removed and a high dielectric constant layer 125 is disposed across the surface of the entire device as depicted in the FIGS. 4A and 4B respectively. FIG. 4B is a cross-sectional view of the device 100 taken at the section AA' of FIG. 4A. FIG. 4B depicts the sequential deposition of the high dielectric constant layer 125 and the electrically conducting layer 127.

Following this, an electrically conducting layer 127 is disposed on the exposed surface of the high dielectric constant layer 125 to facilitate the formation of the gate electrode. In one embodiment, the high dielectric constant layer 125 may comprise a high dielectric constant material having a dielectric constant of about 15 to about 60. Examples of suitable high dielectric constant materials are hafnium oxide, barium strontium tantalate, bismuth titanate, potassium titanate, lead scandium tantalate, lead niobate, potassium niobate, lead zinc niobate, lead magnesium niobate, tantalum pentoxide, yttrium oxide, or the like, or a combination comprising at least one of the foregoing high dielectric constant materials. A preferred high dielectric constant layer 125 is hafnium oxide ($HfO_2$). The high dielectric constant layer 125 generally has a thickness of about 10 to about 50 Angstroms.

The electrically conducting material used for the gate electrode may comprise a metal or a suitably doped material. An example of a suitable doped material is a P+ or N+ doped polysilicon. When the SOI comprises a P+ dopant, it is generally desirable for the gate electrode to comprise P+ doped polysilicon and when the SOI comprises a N+ dopant, it is generally desirable for the gate electrode to comprise N+ doped polysilicon. The electrically conducting layer 127 used in the gate electrode generally has a thickness of about 50 to about 100 nanometers. As can be seen in the FIGS. 8A and 8B, following the deposition of the electrically conducting layer on the entire surface of the device (developed thus far), a second photoresist mask 129 is disposed in order to manufacture the gate electrode.

Figure 5A:
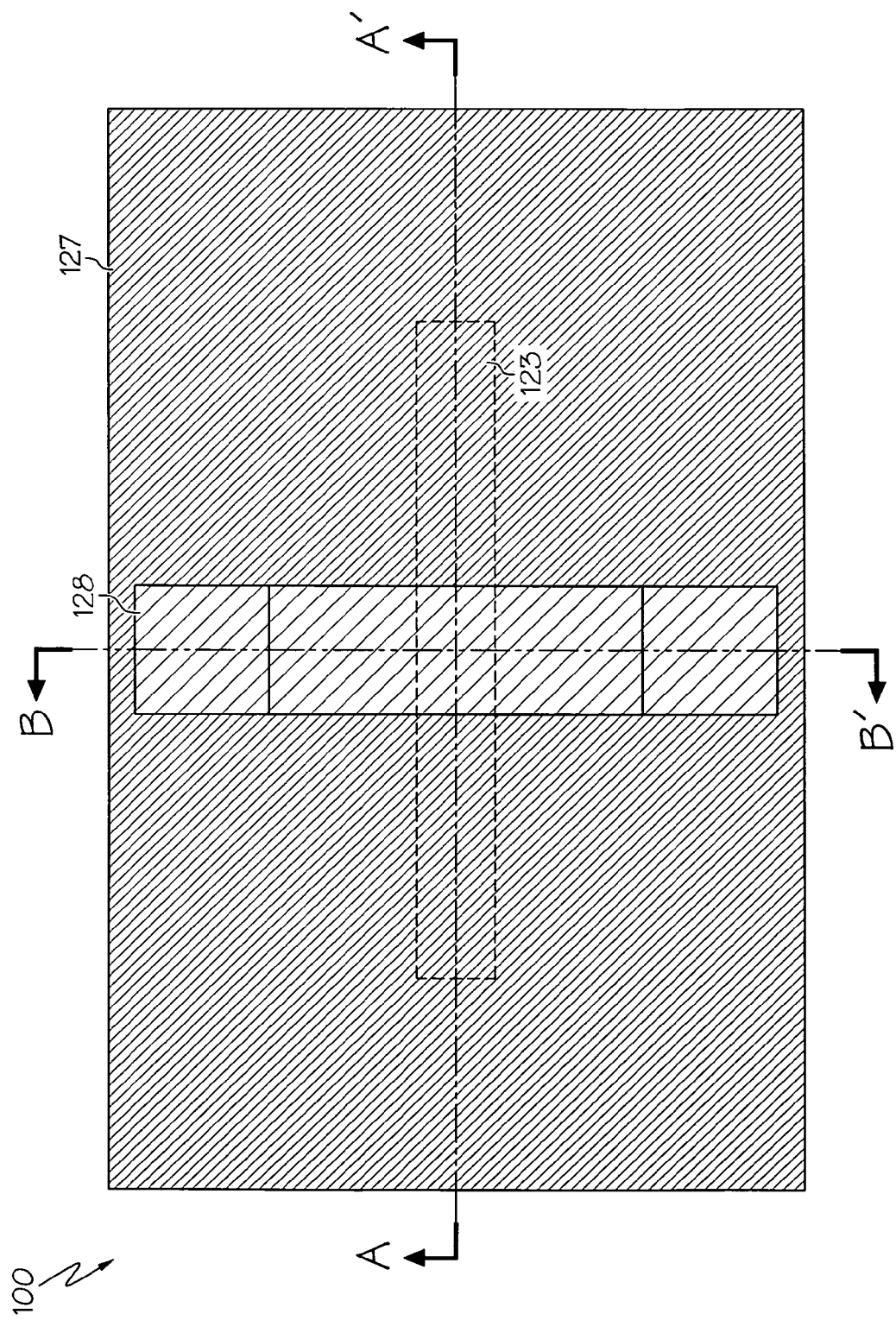
FIG. 5A is an exemplary top view of the device after the RIE of the gate electrode.
Figure 5C:
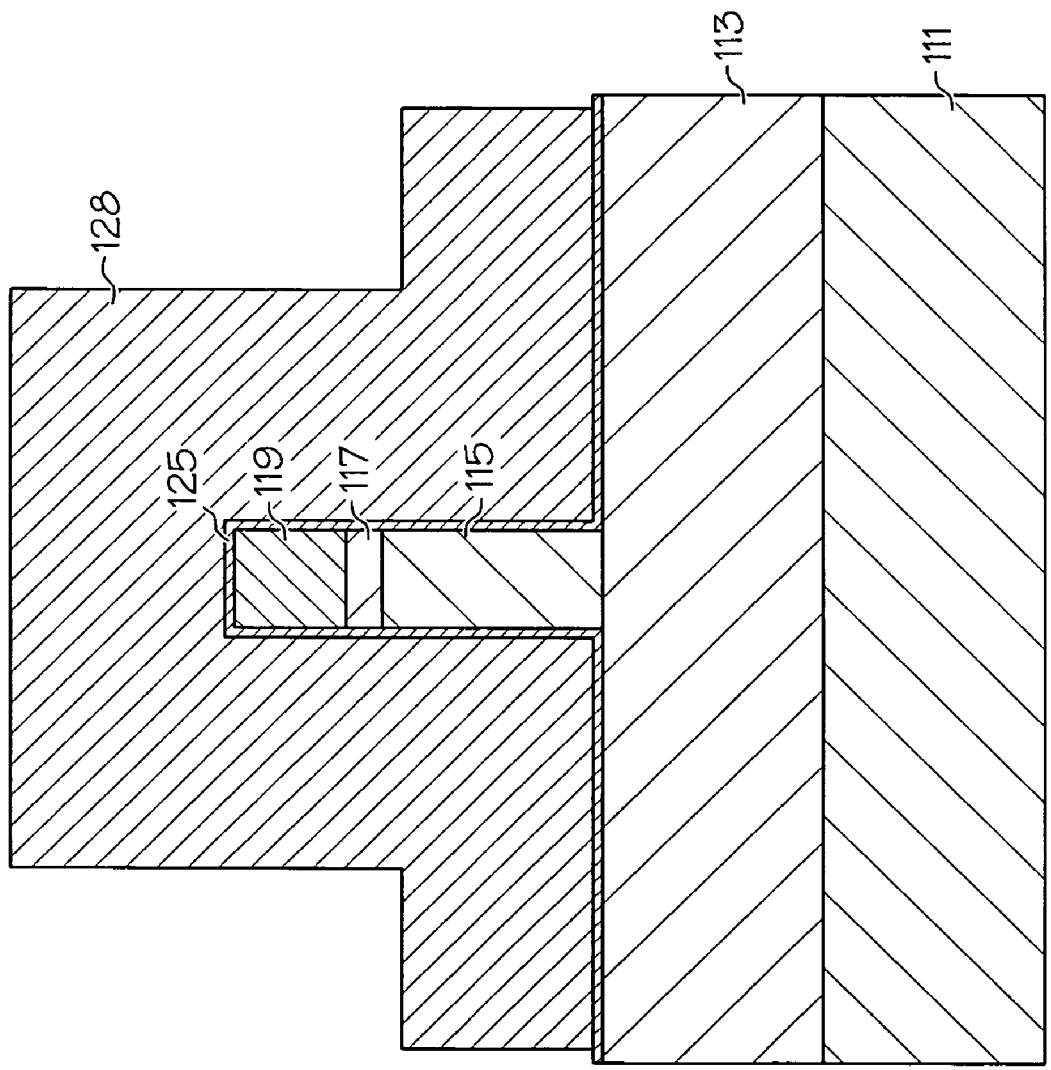
FIG. 5C is an exemplary side view of the device taken along section BB' of the FIG. 5A after the RIE of the gate electrode.

As depicted in the FIGS. 5A, 5B and 5C, a fourth RIE is then performed remove excess electrically conductive material (e.g., P+ doped polysilicon) from the electrically conducting layer 127 to form the gate electrode 128. The FIGS. 5B and 5C are cross-sectional views taken along the sections AA' and BB' of the FIG. 5A respectively. Upon removing the electrically conductive material, the high dielectric constant layer 125 is exposed. The fourth RIE can be conducted with the same halogenated compounds listed above. The photoresist mask 129 is then removed.

Figure 6A:
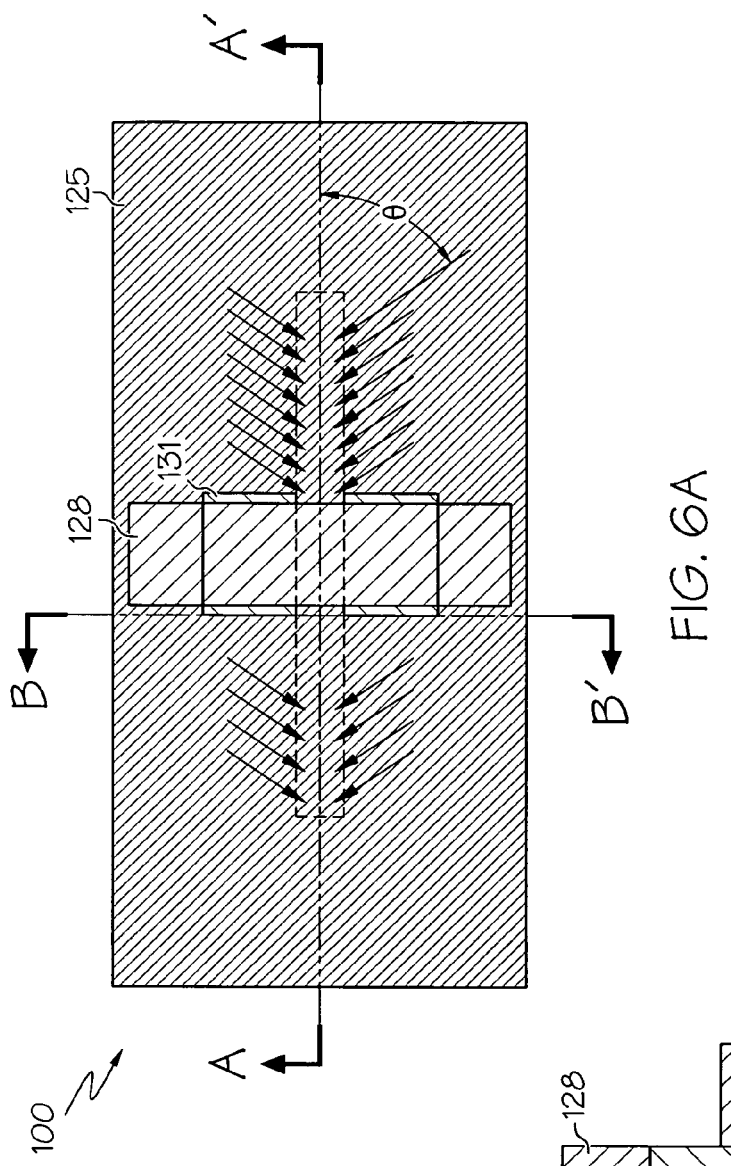
FIG. 6A is an exemplary top view of the device after the deposition of the oxide spacer and during the ion implantation.
Figure 6B:
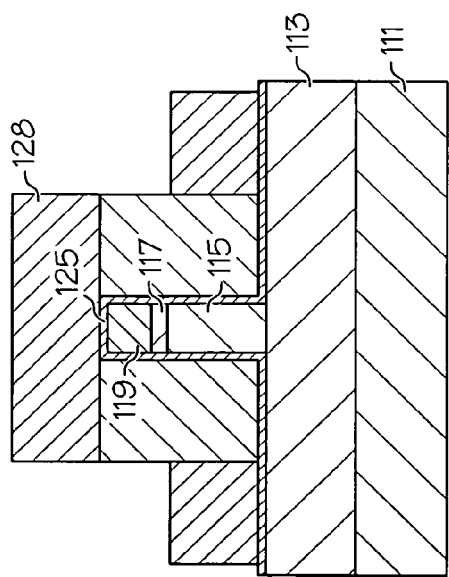
FIG. 6B is an exemplary side view of the device taken along section BB' of the FIG. 6A after the deposition of the oxide spacer.
Figure 6C:
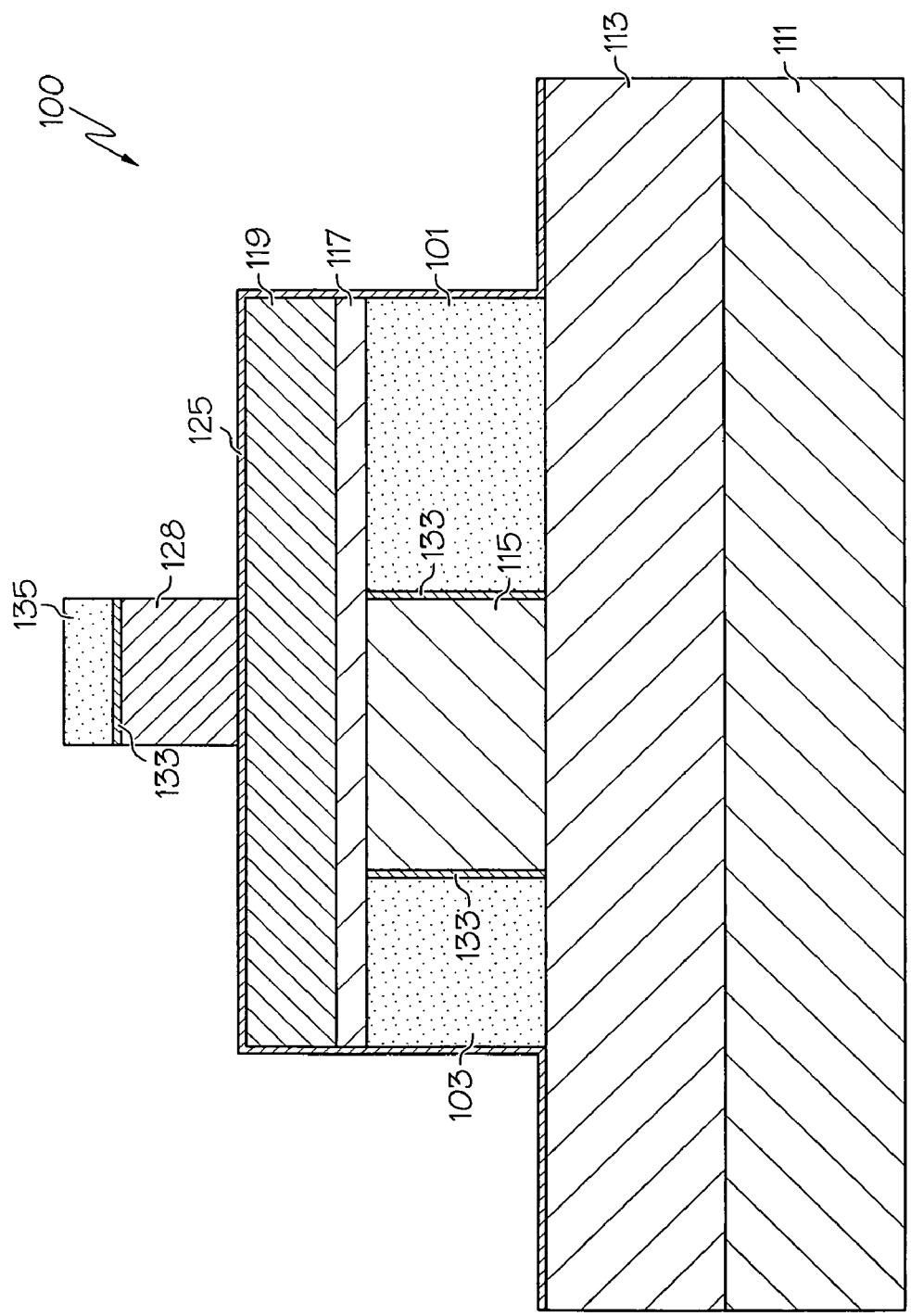
FIG. 6C is an exemplary side view of the device taken along section AA' of the FIG. 6A after the deposition of the oxide spacer.

Following the removal of the photoresist mask 129, a thin oxide layer is disposed upon the surface of the device 100 as depicted in the FIGS. 6A, 6B and 6C. FIG. 6B is a cross-sectional view of the device 100 taken at the section BB' of the FIG. 6A, while the FIG. 6C is a cross-sectional view of the device 100 taken at the section CC'. The thin oxide layer is eventually subjected to an etching process to yield oxide off-set spacers (oxide spacer) that 131 are disposed upon the lower portion of the side-walls of the gate electrode 128 a shown in the FIGS. 6A and 6B. The oxide spacers are used to adjust the P-N junction position formed by later on N+ implantation in the fin and to protect portions of the gate electrode that comprise P+ polysilicon from being converted to an N+ polysilicon.

The thin oxide layer may be deposited by a variety of processes such as low-pressure chemical vapor deposition (LPCVD), plasma enhanced chemical vapor deposition (PECVD), expanding thermal plasma (ETP), metal organic chemical vapor deposition (MOCVD) (also called organometallic chemical vapor deposition (OMCVD)) and metal organic vapor phase epitaxy (MOVPE). Exemplary processes are LPCVD and PECVD. An exemplary oxide for the thin oxide layer is silicon dioxide. After the deposition of the thin oxide layer, the device 100 is subjected to another RIE to form the oxide off-set spacers 131. As can be seen in the FIG. 6B, the oxide off-set spacers 131 cover the gate electrode 128 from the exposed surface of the high dielectric constant layer 125 to the upper surface of the silicon nitride mask 119 that is now part of the fin 123.

Following the disposing of the oxide off-set spacers 131, an angular ion implantation is carried out on the fin 123 which comprises the SOI layer 115. As can be seen in the FIG. 6A, the angular ion implantation is carried out from the source region 101 of the fin 123 to form the tunneling finFET. The angular implantation is conducted to dope the source region 101 of the fin 123 with a dopant that facilitates the formation of a P-N junction. For example, if the SOI layer comprises a P+ dopant such as boron, it is desirable to conduct the angular ion implantation with a N+ dopant such as phosphorus, arsenic or antimony. On the other hand, when the SOI layer comprises a N+ dopant, the angular ion implantation may be conducted with a P+ dopant to form the P-N junction near the gate. This method may be used to produce a complimentary type of tunneling finFET. The dopant concentration can be about $10^{19}$ to about $10^{21}$ atoms/$cm^3$.

It is desirable to carry out the angular implementation at an angle θ of about 45 to about 80 degrees with respect to the line AA'. A preferred angle for carrying out the ion implantation is about 60 degrees with respect to the line AA'. Ion implantation energies are in an amount of about 1 to about 100 kiloelectronvolt (keV).

It is desirable to only dope the source region 101 of the fin 123. However, as depicted in the FIGS. 6A and 6C, some of the ionic dopants get implanted in the drain region 103 of the fin 123 as well as in the regions of the gate electrode that are not protected by the oxide off-set spacers 131. The gate electrode 128 shadows and protects the drain region 103 of the fin 123 from receiving the same amount of ion implantation as the source region 101 of the fin 123 receives. As mentioned above, the oxide off-set spacer also protects regions of the gate electrode that it is disposed upon from ion implantation.

As can be seen in the FIG. 6A, the portion of the drain region 103 of the fin 123 closest to the gate electrode 128 is not subjected to any ion implantation, while in the region further away from the gate electrode 128 the N+ dopants are implanted at a concentration of about $10^{19}$ to about $10^{21}$ atoms/$cm^3$.

Similarly, the upper portion of the gate electrode 128 (that is not protected by the oxide spacer 131) also contains N+ dopants in a concentration of about $10^{19}$ to about $10^{21}$ atoms/$cm^3$. Following the ion implantation, the entire device 100 is subjected to rapid thermal annealing (RTA) at temperatures of about 1,000 to about 1,300° C. to activate the dopant. Activating the dopant comprises repairing any lattice damage that occurs during the ion implantation process and restoring the ions to their desired lattice positions. Alternatively, instead of subjecting the entire device to elevated temperatures in an oven, annealing of only the source and drain regions of the fin 123 may be carried out using a laser beam. Annealing with a laser beam is preferred as it produces a high dopant active concentration in the fin 123 and causes less dopant diffusion both in the fin and the gate electrode 128 than RTA.

This difference in concentration is depicted in the FIG. 6C, which is an exemplary depiction of the section AA' of the FIG. 6A. As can be seen in the FIG. 6C, the ion implantation followed by the annealing produces a first heavily N+ doped SOI region that acts as a source 101, a second heavily N+ doped SOI region that acts as a drain 103, and a heavily P+ type boron doped SOI 115 disposed in between the first and second heavily N+ doped SOI regions. A first P-N junction 133 is located between the first heavily N+ doped SOI region that acts as a source 101 and the heavily P+ type boron doped SOI 115, while the second P-N junction 133 is located between the second heavily N+ doped SOI region that acts as a source 101 and the heavily P+ type boron doped SOI 115.

As noted above the regions of the gate electrode 128 that are not protected by the oxide spacers also get doped with N+ dopant to form N+ doped polysilicon 135. Since the gate electrode 128 generally comprises a P+ doped polysilicon, a third P-N junction 133 is formed between P+ doped polysilicon and the N+ doped polysilicon of the gate electrode 128.

Figure 7A:
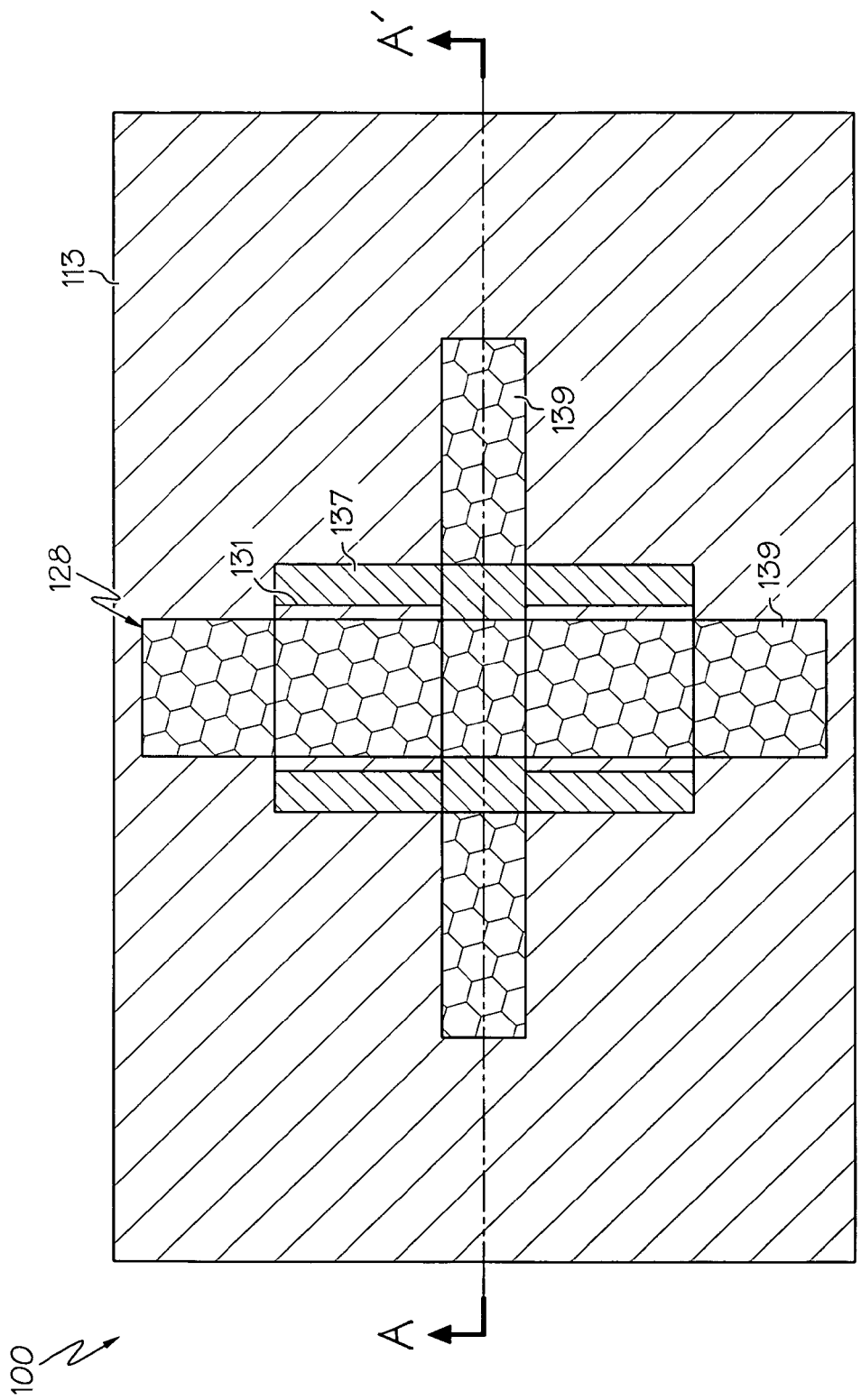
FIG. 7A is an exemplary top view of the device after the silicidation and the formation of the nickel silicide layer.
Figure 7B:
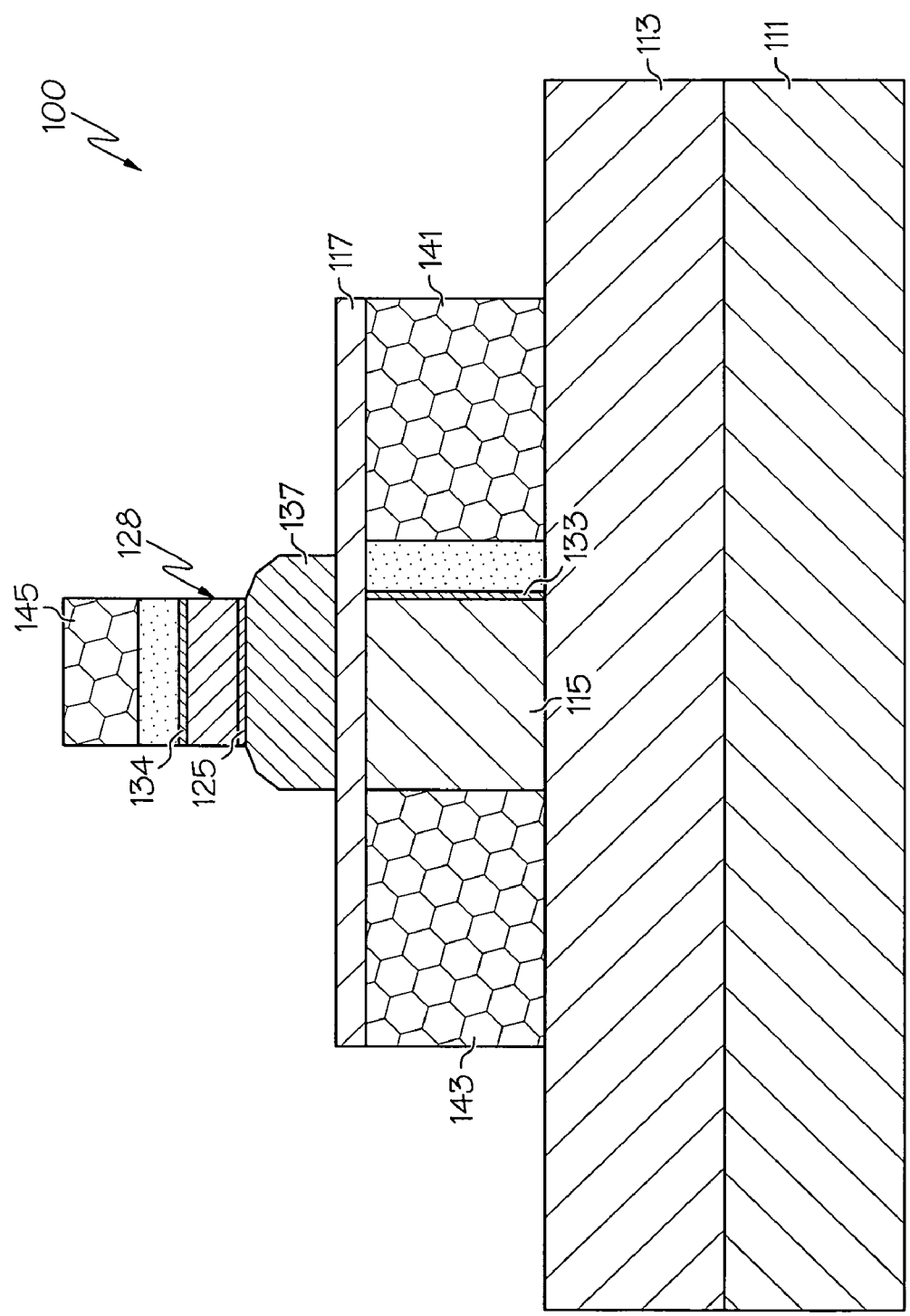
FIG. 7B is an exemplary side view of the device taken along section AA' of the FIG. 7A after the silicidation and the formation of the nickel silicide layer.

With the conversion of a portion of the fin into a source region 101 and another portion of the fin into a drain region 103, the device 100 now becomes a finFET device, i.e., it can now function as a transistor. A nitride layer is however added to the finFET device 100 to form the nitride spacers 137 as depicted in the FIGS. 7A, 7B and 7C. FIG. 7B is an exemplary schematic view of the cross-section of the finFET device taken at section AA' of the FIG. 7A after the disposing of the nitride spacer and the nickel to form a nickel silicide layer 139. FIG. 7C is an exemplary schematic view of the cross-section of the finFET device taken at section BB' of the FIG. 7A. The nitride layer has a thickness of about 20 to about 50 nanometers. It is desirable to have the nitride spacer 137 disposed only on the exposed surfaces of the oxide spacer. It may therefore be desirable to remove any excess nitride applied to the finFET device. An RIE can be used to remove excess nitride that is deposited on other regions of the finFET device 100. The RIE is also used to etch away the high dielectric constant layer 125 (e.g., the $HfO_2$ layer).

From the FIGS. 7A-7C, it can be seen that following the RIE to remove the high dielectric constant layer 125, a silicide process is performed on the exposed surfaces of the gate electrode 128 and the source and drain regions 101 and 103 respectively. Following this nickel is deposited on the regions coated with the silicide to form a nickel silicide body. In one embodiment, the finFET device is annealed to temperatures of about 350 to about 500° C. to promote the reaction between nickel and the silicide. A wet etch may be performed to remove unreacted nickel.

As can be seen in the FIG. 7B, the nickel silicide body disposed upon the BOX layer 113 comprises a first nickel silicide region 141 and a second nickel silicide region 143. The first and the second nickel silicide regions are in contact with a tunneling device formed by the heavily N+ doped SOI region and the heavily doped P+ doped region. The fin thus comprises the first and the second nickel silicide regions and a tunneling device formed by the heavily N+ doped SOI region and the heavily doped P+ doped region. The contact between the heavily N+ doped SOI region and the heavily doped P+ doped region, both of which are disposed on the BOX layer 113 form a first P-N junction 133 for tunneling. The first and second nickel silicide regions 141, 143, thus straddle the fist P-N junction formed by the heavily N+ doped SOI region and the heavily doped P+ doped region to form a first short between the N+ and P+ doped regions.

Disposed across the fin is the gate electrode 128, which now comprises a second P-N junction 134 formed by the P+ doped polysilicon and the N+ doped polysilicon. Also disposed on the gate electrode is a third nickel silicide region that straddles the second P-N junction to form a second short between the N+ and P+ doped regions of the gate electrode.

The first P-N junction 133 being a portion of the fin 123 is disposed on an opposing surface of the pad oxide 117 from the second P-N junction 134.

Tunneling FET uses band-to-band tunneling effect to turn on and off a transistor. When both n dopant and p dopant concentrations between a P-N junction are very high, the band-gap becomes small in the depletion region. When a reverse bias is applied on the P-N junction, the band-gap can become very even smaller so that tunnel current crossing the P-N junction will dramatically increase. In a tunneling finFET, one can use gate voltage to adjust the bias between the P-N junction near the gate to achieve the purpose of tuning on and off the tunneling finFET. The tunneling finFET device 100 disclosed above has a number of advantageous features. Short channel effects have been improved due to double gate structure. Tunneling finFET has no floating body effects and also further improves the short channel effect. The subthreshold swing is minimized and power consumption is reduced. Performance is comparable to a metal oxide semiconductor field effect transistor (MOSFET). The tunneling finFET device may advantageously be used in a number of areas such as computers and the like.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a tunneling fin field effect transistor comprising:

disposing a pad oxide layer and a silicon nitride mask layer on a silicon on insulator layer; the silicon on insulator layer comprising a silicon wafer, a buried oxide layer and a silicon on insulator layer; the silicon on insulator layer comprising a P+ type or N+ type doped silicon on insulator;

etching a fin; the fin comprising the silicon on insulator layer, the pad oxide layer and the silicon nitride mask layer;

disposing a high dielectric constant layer and an electrically conducting layer on the fin;

reactively ion etching the electrically conducting layer to form a gate electrode;

disposing an oxide offset spacer on the gate electrode;

ion implanting a N+ dopant or a P+ dopant in the fin; the ion implanting being conducted at an angle of about 45 to about 80 degrees, with respect to a longitudinal axis of the wafer; the ion implanting creating a source region and a drain region in the fin; the ion implanting also creating a N-doped or a P-doped region in the gate electrode;

disposing a nitride spacer on the gate electrode; and
disposing a nickel silicide layer on the wafer to form an electrical short between N+ and P+ doped regions; and
forming a tunneling device on the buried oxide layer; the tunneling device comprising an N+ doped region and the P+ type doped silicon on insulator.

2. The method of claim 1, wherein the silicon on insulator layer has a thickness of about 50 to about 100 nanometers.

3. The method of claim 1, wherein the pad oxide layer has a thickness of about 5 to about 10 nanometers and the silicon nitride mask layer has a thickness of about 20 to about 50 nanometers.

4. The method of claim 1, wherein the fin has a width of about 5 to about 10 nanometers and is disposed on the buried oxide layer.

5. The method of claim 1, wherein the etching of the fin and the reactively ion etching of the electrically conducting layer are both conducted with a halogenated compound.

6. The method of claim 1, wherein the high dielectric constant layer comprises hafnium oxide.

7. The method of claim 1, wherein the electrically conducting layer comprises P+ doped polysilicon.

8. The method of claim 7, wherein the electrically conducting layer has a thickness of about 50 to about 100 nanometers.

9. The method of claim 1, further comprising disposing a photoresist on the nitride mask layer prior to the etching of the fin or disposing a resist on the electrically conducting layer prior to the etching of the gate electrode.

10. The method of claim 1, wherein the ion implanting of the N+ dopant in the fin region produces a source region that is completely n-doped and a drain region that is partially n-doped.

11. The method of claim 1, further comprising reactively ion etching the high dielectric constant layer after the disposing of the nitride spacer.

12. The method of claim 1, further comprising conducting a silicide process after the disposing of the nitride spacer.

13. An article formed by the method of claim 1.

* * * * *